(12) United States Patent
Lee et al.

(10) Patent No.: US 7,447,018 B2
(45) Date of Patent: Nov. 4, 2008

(54) DISPLAY APPARATUS

(75) Inventors: Kyung-kyun Lee, Seoul (KR);
Hyun-jun Jung, Suwon-si (KR);
You-sub Lee, Gunpo-si (KR); Doo-soon Park, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 456 days.

(21) Appl. No.: 11/226,242

(22) Filed: Sep. 15, 2005

(65) Prior Publication Data

US 2006/0104023 A1 May 18, 2006

(30) Foreign Application Priority Data

Nov. 17, 2004 (KR) .............. 10-2004-0093957

(51) Int. Cl.
*H05K 7/20* (2006.01)
(52) U.S. Cl. ............... 361/695; 361/687; 361/690; 361/694
(58) Field of Classification Search ............... None
See application file for complete search history.

(56) References Cited

U.S. PATENT DOCUMENTS

| | | | |
|---|---|---|---|
| 6,549,403 B1 | 4/2003 | Ovadia et al. | |
| 6,807,051 B2 * | 10/2004 | Takahashi | ............... 361/681 |
| 7,014,558 B2 * | 3/2006 | Oh | ............... 454/184 |
| 7,164,586 B2 * | 1/2007 | Lin | ............... 361/714 |
| 7,269,009 B2 * | 9/2007 | Ryu et al. | ............... 361/692 |
| 2005/0047067 A1 * | 3/2005 | Bang et al. | ............... 361/681 |

FOREIGN PATENT DOCUMENTS

| | | |
|---|---|---|
| CN | 1508619 A | 6/2004 |
| KR | 1997-63689 | 12/1997 |
| KR | 20-167100 | 10/1999 |
| KR | 10-242834 | 11/1999 |
| KR | 2000-19509 | 1/2000 |
| KR | 2004-64584 | 7/2004 |

OTHER PUBLICATIONS

Chinese Office Action dated Dec. 21, 2007 issued in CN200510117683.X.

* cited by examiner

*Primary Examiner*—Boris L Chervinsky
(74) *Attorney, Agent, or Firm*—Stanzione & Kim, LLP

(57) ABSTRACT

A display apparatus includes a display panel to display a picture, a main PCB to operate the display panel, a shield cover coupled to the main PCB, a front cover and a rear cover respectively coupled to the display panel and to the shield cover, and forming an external appearance of the display apparatus, and a fan assembly comprising a cooling fan, and a fan housing to accommodate the cooling fan and coupled between the main PCB and the shield cover to supply external air through the cooling fan to internal parts of the display apparatus. Accordingly, the display apparatus includes the cooling fan to directly cool the internal parts of the display apparatus.

19 Claims, 5 Drawing Sheets

DISPLAY APPARATUS

CROSS-REFERENCE TO RELATED APPLICATIONS

This application claims the benefit under 35. U.S.C. § 119 of Korean Patent Application No. 2004-93957, filed on Nov. 17, 2004, in the Korean Intellectual Property Office, the disclosure of which is incorporated herein in its entirety by reference.

BACKGROUND OF THE INVENTION

1. Field of the Invention

The present general inventive concept relates to a display apparatus, and more particularly, to a display apparatus having a cooling fan to directly cool internal parts of the display apparatus.

2. Description of the Related Art

Generally, a display apparatus such as a television (hearinbelow, referred to as TV) receives a public broadcasting signal and transmits a limited number of broadcasting channels to a user. However, a TV receiving a cable broadcasting signal or a satellite broadcasting signal supplies more than dozens of broadcasting channels, thereby increasing its use because it can satisfy various wants of a user.

In the case of the TV receiving the cable broadcasting signals, if the user pays a basic charge, the user can watch only public broadcasting channels and basic cable channels. If the user pays over a predetermined additional charge, the user can watch the public broadcasting channels, the basic cable channels, and additional premium cable channels. Accordingly, it is preferable but not necessary to equip a reception-limited card in the display apparatus receiving the cable broadcasting signal. The reception-limited card has data of a subscriber stored therein. Also, the reception-limited card allows the subscriber to watch the pay channels after confirming the subscriber's subscription. The reception-limited card is provided as a PCMCIA (personal computer memory card international association) card mounted with a smart card saving the data of the subscriber. The reception-limited card of this type is defined as a point of deployment (POD) card. The POD card transmits the management data of the subscriber. Also the POD card receives various charged signals. Therefore, the reception-limited card makes possible to bill the charged services in various ways.

In the case that the POD card is mounted in a thin display apparatus such as a LCD (liquid crystal display) or a PDP (plasma display panel), the POD card is coupled to a PCB (printed circuit board), which is provided in back of a display panel. Accordingly, heat generated from the POD card is transmitted to the PCB and the display panel, and thereby disturbs forming an image in the display panel.

A back plate for cooling the PDP TV is disclosed in Korean Utility Model No. 20-167100. The back plate for cooling the PDP TV comprises material of aluminum back plate having a curve structure to cool heat generated when the PDP TV operates, a cooling pin protruded from the curve structure, and a cooling part having an air ventilation path subsided from the curve structure and serving as a path of external air. Thus, there is an effect that a PDP device of the PDP TV is cooled.

However, in such a conventional display apparatus, it is difficult to directly cool the heat generated from the POD card or the like and transmitted to the internal parts of the display apparatus.

SUMMARY OF THE INVENTION

Accordingly, the present general inventive concept provides a display apparatus having a cooling fan to directly cool internal parts of the display apparatus.

Additional aspects of the present general inventive concept will be set forth in part in the description which follows, and in part, will be obvious from the description, or may be learned by practice of the present general inventive concept.

The foregoing and/or other aspects of the present general inventive concept are achieved by providing a display apparatus comprising a display panel to display a picture, a main PCB to operate the display panel, a shield cover coupled to the main PCB, a front cover and a rear cover respectively coupled to the display panel and to the shield cover and forming an external appearance, and a fan assembly comprising a cooling fan, and a fan housing to accommodate the cooling fan and coupled between the main PCB and the shield cover to transmit external air supplied from the cooling fan to internal parts of the display apparatus.

The fan assembly may comprise a penetrating part to pass through the air ventilated from the cooling fan, and the shield cover may comprise a fan exposing part to expose the cooling fan therethrough.

The fan assembly may comprise a card inserting hole to insert a POD card therein.

The rear cover may comprise a through hole formed corresponding to a position of the cooling fan to allow the external air to pass therethrough, and a card insert part corresponding to a position of the card insert hole of the fan assembly.

The foregoing and/or other aspects of the present general inventive concept are also achieved by providing a display apparatus comprising a display to display an image thereon, a printed circuit board to control the display and having a socket to accommodate a POD card therein, and a cooling fan aligned with the socket of the printed circuit board to force air directly toward the POD card accommodated in the socket to cool the POD card and internal parts of the display apparatus.

The foregoing and/or other aspects of the present general inventive concept are also achieved by providing a display apparatus comprising a display to display an image thereon, a cover to support the display and to enclose internal parts of the display apparatus, a printed circuit board (PCB) disposed within the cover to control the display, an air path to circulate air within the cover to cool the PCB and the internal parts of the display apparatus, and a cooling fan disposed along the air path to direct the air to a predetermined portion of the PCB.

The foregoing and/or other aspects of the present general inventive concept are also achieved by providing a display apparatus comprising a display to display an image thereon, a printed circuit board (PCB) to control the display and having a connection portion to connect to a predetermined card, a fan assembly comprising a fan housing coupled to the PCB at a position corresponding to the connection portion, a cooling fan mounted at the fan housing to circulate air toward the PCB, and a first card inserting hole formed at a side of the fan housing and communicating with the connection portion of the PCB to allow the predetermined card to be inserted therethrough the connect to the connection portion.

BRIEF DESCRIPTION OF THE DRAWINGS

These and/or other aspects of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
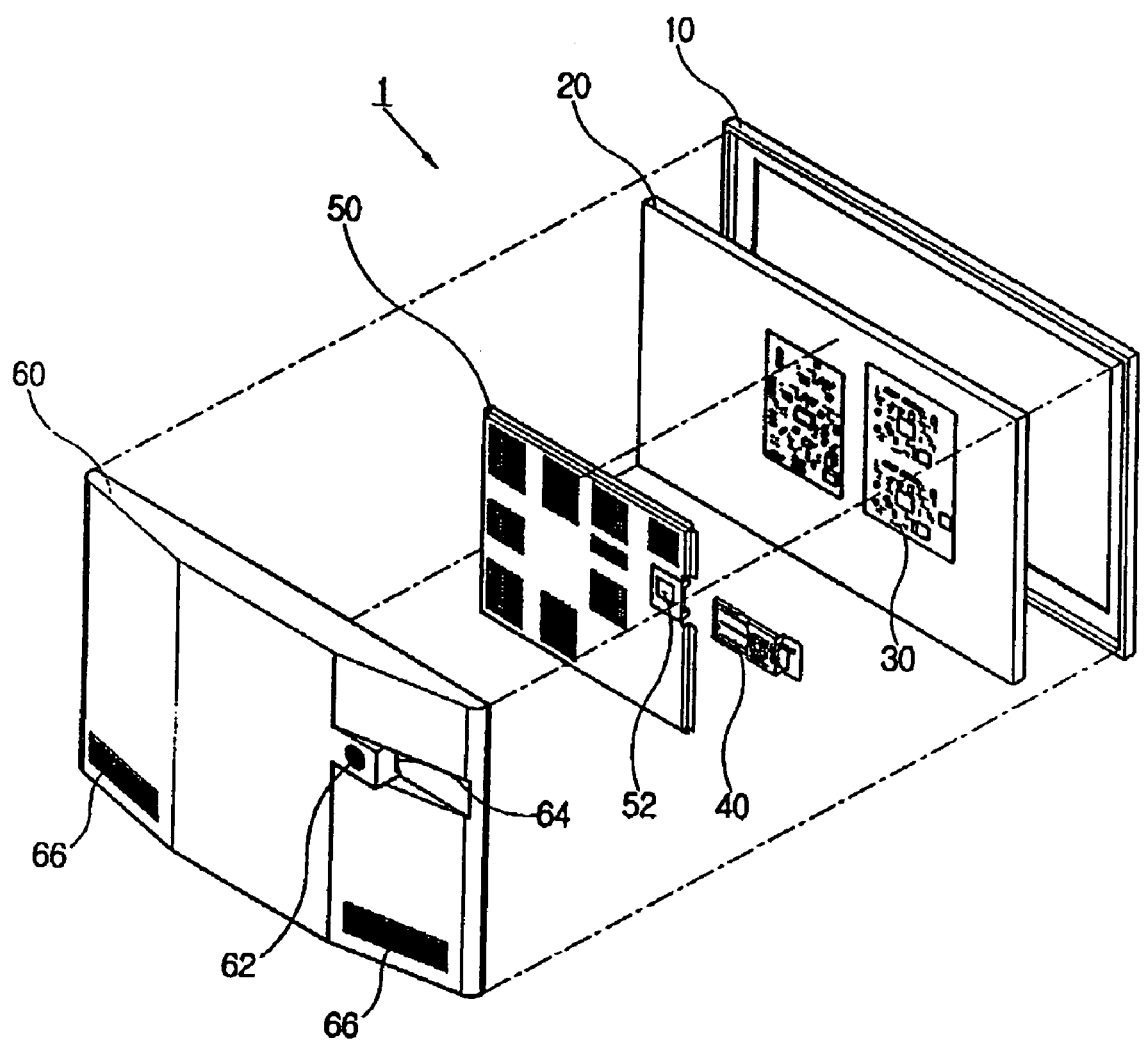
FIG. 1 is an exploded perspective view illustrating a display apparatus according to an embodiment of the present general inventive concept.

Reference will now be made in detail to the embodiments of the present general inventive concept, examples of which are illustrated in the accompanying drawings, wherein like reference numerals refer to like elements throughout. The embodiments are described below in order to explain the present general inventive concept while referring to the figures.

FIGS. 1 through 5 illustrate a display apparatus 1 according to an embodiment of the present general inventive concept. Referring to FIGS. 1 through 5, the display apparatus 1 comprises a display panel 20 to display a picture, a main PCB (printed circuit board) 30 to operate the display panel 20, a fan assembly 40 mounted with a cooling fan 46 and coupled to the main PCB 30, a shield cover 50 to cover the fan assembly 40, and a front cover 10 and a rear cover 60 to accommodate the above members and to form an external appearance of the display apparatus 1.

Figure 2:
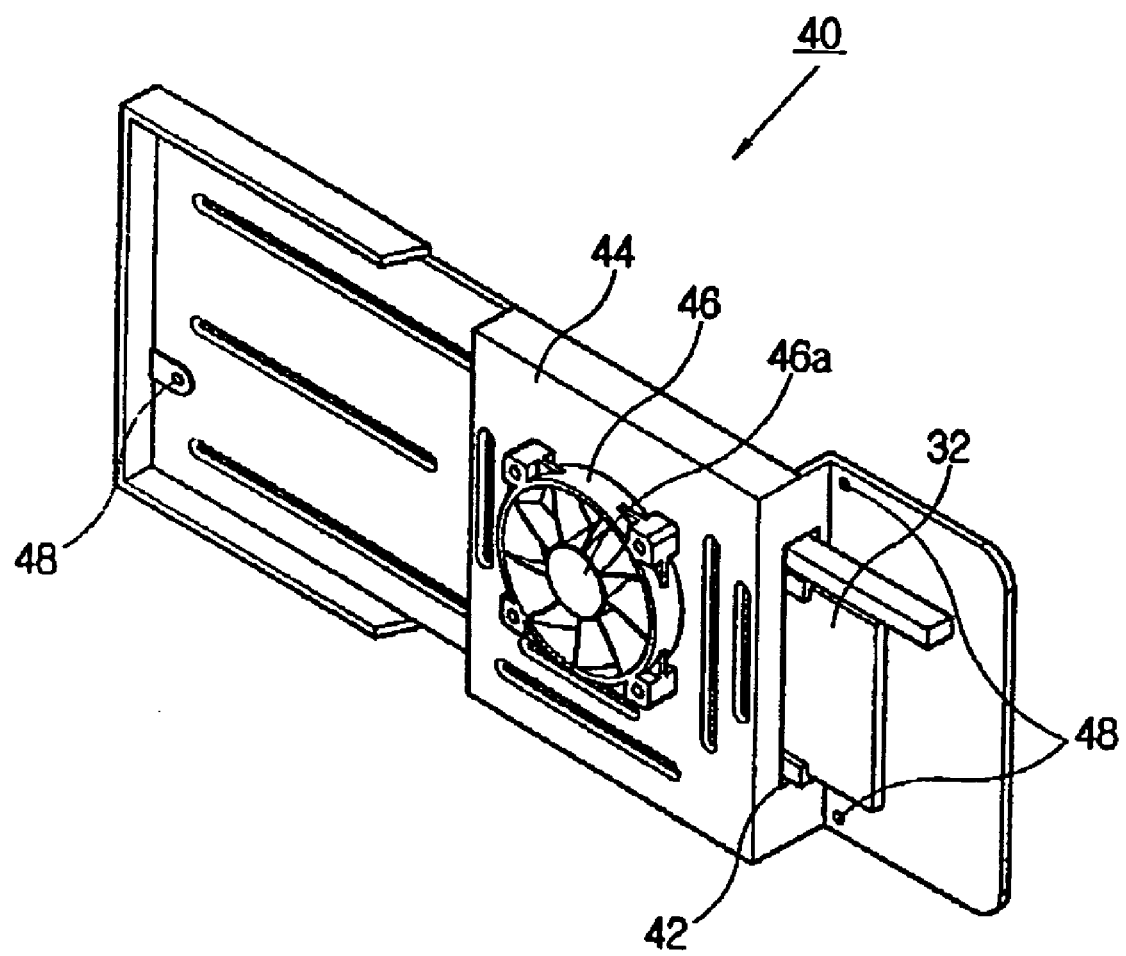
FIG. 2 is a perspective view illustrating a fan assembly of the display apparatus of FIG. 1.
Figure 3:
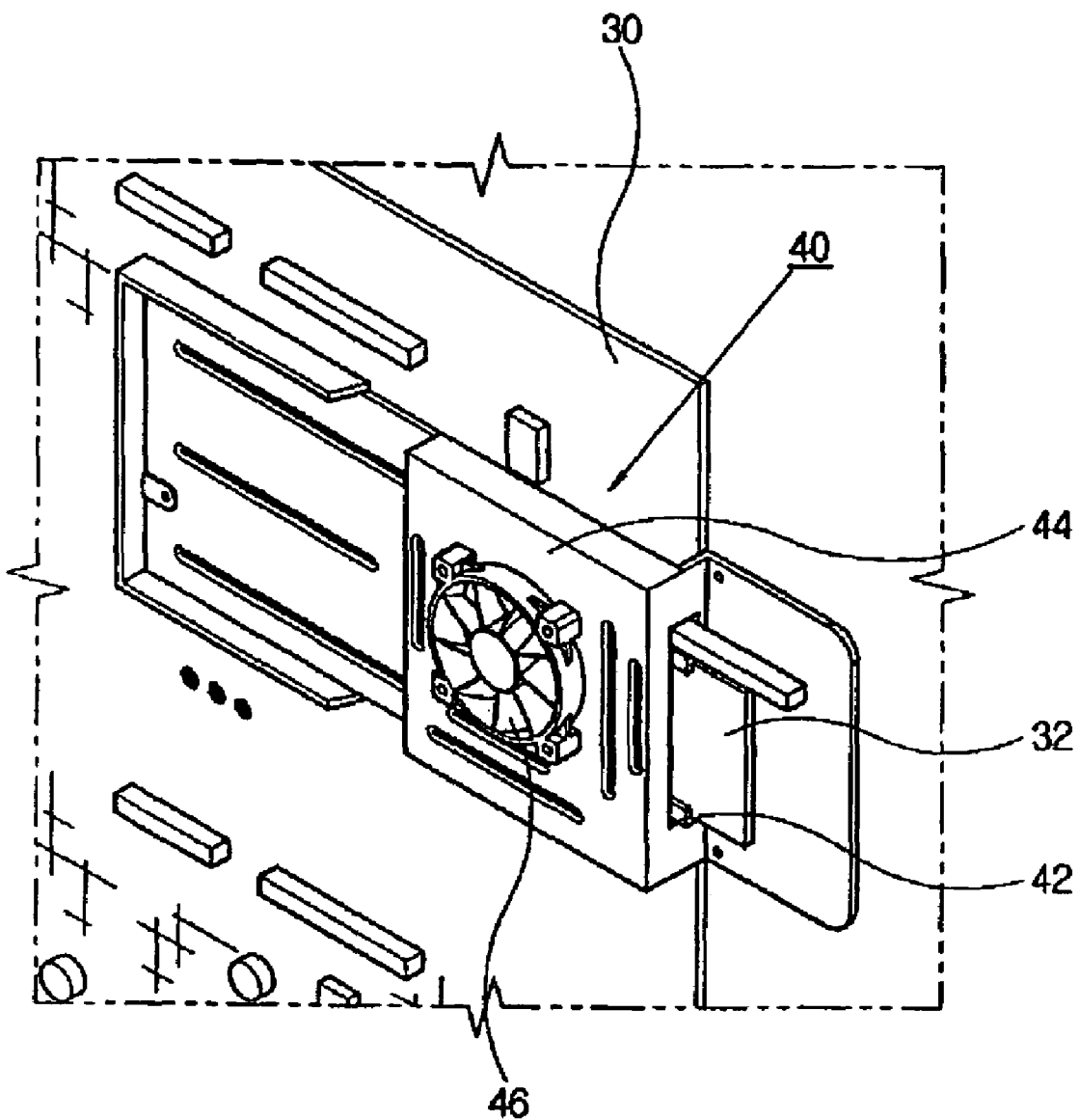
FIG. 3 is a perspective view illustrating a main PCB and the fan assembly of the display apparatus of FIG. 1.

As illustrated in FIG. 2 and FIG. 3, a POD (point of deployment) card 32 can be mounted on the main PCB 30 at a POD socket (not shown) provided in the main PCB 30. The POD card 32 can be provided as a PCMCIA (personal computer memory card international association) card. The POD card 32 can be installed by a user after the display 1 apparatus is assembled. Heat generated while using the POD card 32 is transmitted to internal parts of the display apparatus 1 and may influence operations of the main PCB 30 or the display panel 20. Thus, the fan assembly 40 mounted with the cooling fan 46 is coupled adjacent the POD card 32 when the POD card 32 is mounted on the main PCB 30 to cool the POD card 32.

The fan assembly 40 can be made of a metal material. The fan assembly 40 comprises the cooling fan 46, a fan housing 44 equipped with the cooling fan 46, a card inserting hole 42 to accommodate the POD card 32 therein, and a housing fixing part 48 to mount the fan assembly 40 on the main PCB 30.

The fan housing 44 of the fan assembly 40 may include a plate to support the cooling fan 46. Also the fan housing 44 can be provided to have such a height that it does not interfere with the POD card 32 and the cooling fan 46. A penetrating part (not shown) can be provided at a predetermined portion of the fan housing to transmit external air supplied through the cooling fan 46 to internal parts of the display apparatus 1. The cooling fan 46 is mounted within the fan housing 44 to be aligned with the penetrating part to supply the external air to the penetrating part.

The cooling fan 46 can be fixed in the fan housing 44 by a screw or the like. The cooling fan 46 can be integrally provided with a motor 46a at a middle portion thereof to operate the cooling fan 46. A wire can be connected to the motor 46a to supply power to the motor 46a. That is, the wire can extend from the fan assembly 40 to connect the motor 46a to a power source. The wire can be connected to a fan connector on the main PCB 30 in order to operate the cooling fan 46. The card insert hole 42 can be provided on a side of the plate of the fan housing 44 that supports the cooling fan 46.

The card insert hole 42 is provided to correspond to a size of the POD card 32. A plate part of the fan assembly 40 extends a predetermined length from the card insert hole 42 and includes the housing fixing part 48, which fixes the fan assembly 40 to the main PCB 30. The card insert hole 42 can communicate externally with respect to the display apparatus 1 without being blocked by the shield cover 50 or the rear cover 60.

Figure 4:
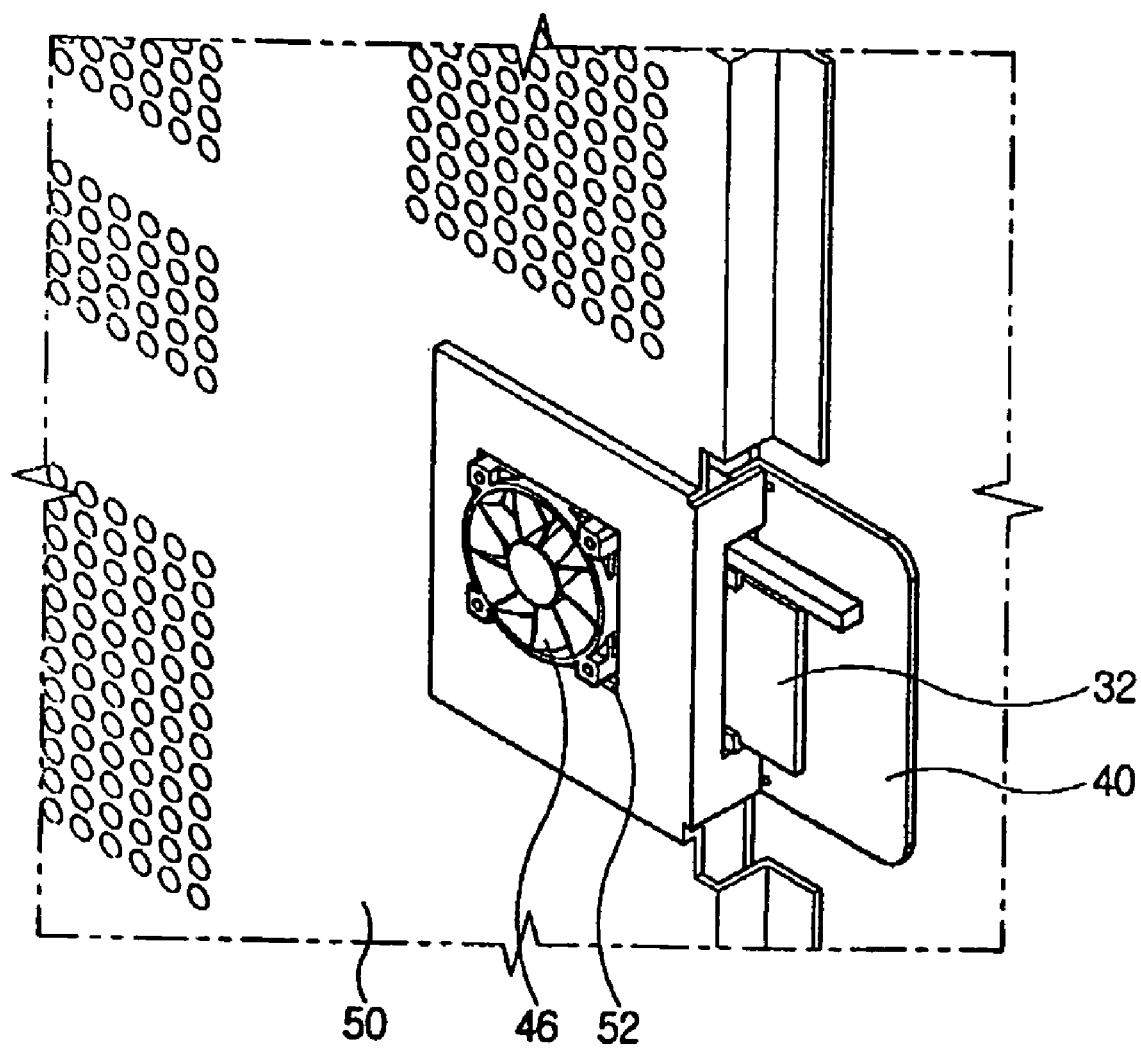
FIG. 4 is a perspective view illustrating a shield cover and the fan assembly of the display apparatus of FIG. 1.

As illustrated in FIG. 4, the shield cover 50 supports and accommodates the main PCB 30 mounted with the fan assembly 40. The shield cover 50 is provided with a fan exposing part 52, which corresponds to the position of the cooling fan 46 to expose the cooling fan 46 through the shield cover 50. Also, a side portion of the shield cover 50 is cut to correspond to a shape of the card insert hole 42 to prevent the shield cover 50 from blocking the card insert hole 42 provided in the fan assembly 40. The shield cover 50 can be coupled to the rear cover 60.

Figure 5:
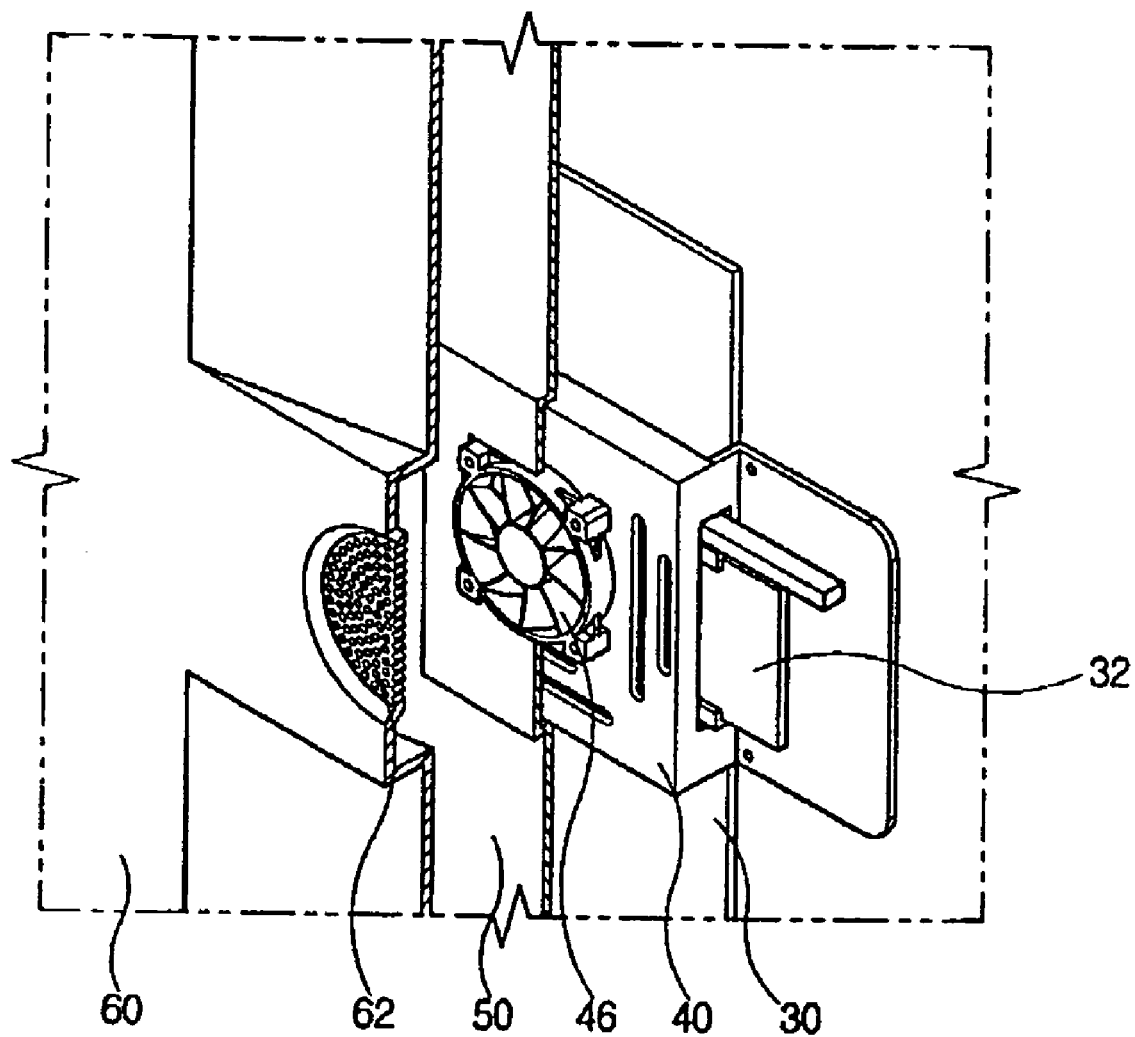
FIG. 5 is a rear cutaway perspective view illustrating the display apparatus of FIG. 1.

As illustrated in FIGS. 1 and 5, the rear cover 60 forms an external appearance by coupling with the front cover 10 by a coupling method, such as a hook, a snap, a screw, or the like. A plurality of through holes 62 are provided in the rear cover 60, which correspond to the position of the cooling fan 46 and the fan exposing part 52 to allow air to pass through. A card insert part 64 corresponding to a position of the card insert hole 42 is also formed on the rear cover 60. The card insert part 64 may have a shape corresponding to a shape of the card insert hole 42, such as a square or rectangular shape. The air passing through the through holes 62 can exit the display apparatus 1 through ventilating holes 66 provided in the rear cover 60 after circulating through the display apparatus 1 and cooling the internal parts of the display apparatus 1.

With the above described configuration, a coupling process of the fan assembly 40 of the display apparatus 1 according to the present embodiment of the present general inventive concept is described below.

The main PCB 30 is coupled to a back portion of the display panel 20. The POD socket is provided in the main PCB 30 to be connected with the POD card 32. The POD card 32 can be installed in the main PCB 30 when the display apparatus 1 is assembled, or installed in the display apparatus 1 by a user after the display apparatus 1 is assembled.

The fan assembly 40 is coupled to the main PCB 30 at a position corresponding to the POD socket to accommodate the POD card 32. The fan assembly can be fixed to the main PCB 30 by a screw or the like. The cooling fan 46 is provided at the fan assembly to be close to the POD card 32 when the POD card 32 is installed in the main PCB 30 to cool the POD card 32. The air supplied by the cooling fan 46 also cools the internal parts of the display apparatus 1 by passing through an air path formed in an inner portion of the display apparatus 1. The air supplied by the cooling fan 46 exits the display apparatus 1 through the ventilating holes 66 formed in the rear cover 60.

In the state in which the fan assembly 40 is coupled to the main PCB 30, the shield cover 50 is coupled to the main PCB 30. The shield cover 50 is provided with the fan exposing part 52 to expose the cooling fan 46 through the shield cover 50. Accordingly, when the shield cover 50 is coupled to the main PCB 30, the cooling fan 46 is exposed through the fan exposing part 52.

After the shield cover 50 is couple to the main PCB 30, the front cover 10 and the rear cover 60 are respectively coupled to the display panel 20 and to the the shield cover 50, thereby forming an external appearance of the display apparatus 1. The cooling fan 46 can then supply air from outside of the display apparatus 1 through the through holes 62 to the internal parts of the display apparatus 1 because the plurality of through holes 62 are formed on the rear cover 60 to correspond to the position of the cooling fan 46.

The display apparatus 1 can be offered as a finished product to the user, and the user can use the POD card 32 in the display apparatus 1 as necessary. As illustrated in FIGS. 1-5, the card insert part 64 to insert the POD card 32 therethrough is provided at one side of the rear cover 60. Thus, the side cutting part of the shield cover 50 and the card insert hole 42 of the fan assembly 40, as well as the POD socket of the main PCB 30, are equipped to correspond to the position of the card insert part 64 of the rear cover 60.

When the cooling fan 46 is operated after the POD card 32 is installed in the display apparatus 1, air passes through the through hole 62 of the rear cover 60 and then passes through the cooling fan 46. The air then passes through the penetrating part of the fan assembly 40 and is directly conveyed to the POD card 32. The air is also supplied to the internal parts of the display apparatus 1 by the fan assembly 40. The air cools the internal parts of the display apparatus 1, such as the main PCB 30, the display panel 20, and the like. The air exits the display apparatus 1 through the ventilating holes 66 provided in the rear cover 60.

Accordingly, the display apparatus 1 is cooled down effectively because the cooling fan 46 cools the internal parts of the display apparatus 1 by supplying air through the through holes 62 provided in the rear cover 60 of the display apparatus 1.

Also, when the POD card 32 or the like is installed in the display apparatus 1, the cooling fan 46 effectively cools down heat generated from the POD card 32 or the like.

Although in the foregoing embodiment, the cooling fan 46 is used to cool the POD card 32, the cooling fan 46 may additionally be used to cool internal parts of the display apparatus 1 in a body of the display apparatus without the POD card.

As illustrated in FIGS. 1-5, the fan assembly 40 is coupled to the main PCB 30 through the housing fixing part 48. The fan assembly 40 may be coupled to the main PCB using any coupling method, such as, for example, a screw, a hook, a rivet, etc.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A display apparatus comprising:
    a display panel to display a picture;
    a main PCB to operate the display panel;
    a shield cover coupled to the main PCB;
    a front cover and a rear cover respectively coupled to the display panel and the shield cover, and forming an external appearance; and
    a fan assembly comprising a cooling fan, and a fan housing to accommodate the cooling fan and coupled between the main PCB and the shield cover to supply external air through the cooling fan to internal parts of the display apparatus.

2. The display apparatus according to claim 1, wherein the fan assembly comprises a penetrating part to pass through the air supplied from the cooling fan, and the shield cover comprises a fan exposing part to expose the cooling fan therethrough.

3. The display apparatus according to claim 2, wherein the fan assembly comprises a card inserting hole to insert a POD card therein.

4. The display apparatus according to claim 3, wherein the rear cover comprises a through hole formed corresponding to a position of the cooling fan to allow the external air to pass therethrough, and a card insert part corresponding to a position of the card insert hole of the fan assembly.

5. The display apparatus according to claim 1, wherein the fan assembly comprises a card inserting hole to insert a POD card.

6. The display apparatus according to claim 1, wherein the rear cover comprises a through hole formed corresponding to a position of the cooling fan to allow the external air to pass through, and a card insert part corresponding to a position of the card insert hole of the fan assembly.

7. The display apparatus according to claim 1, wherein the rear cover comprises at least one through hole to aligned with the cooling fan to allow the external air to enter the display apparatus and at least one ventilating hole to allow the external air to exit the display apparatus.

8. A display apparatus, comprising:
    a display to display an image thereon;
    a printed circuit board to control the display and to receive a POD card therein; and
    a cooling fan aligned with a position of the POD card installed on the printed circuit board, and to force air directly toward the POD card to cool the POD card and internal parts of the display apparatus.

9. The display apparatus according to claim 8, further comprising:
    a cover to form an outer appearance of the display apparatus and including one or more air holes aligned with the cooling fan to supply the air to the cooling fan and an open portion to insert the POD card therethrough.

10. The display apparatus according to claim 9, further comprising:
    a shield wall formed between the cover and the printed circuit board and including a fan exposing hole disposed between the air holes of the cover and the cooling fan to allow the air to pass therethrough.

11. The display apparatus according to claim 9, wherein the cover further includes exit air holes to allow the air forced directly toward the POD card by the cooling fan to exit the display apparatus therethrough.

12. A display apparatus, comprising:
    a display to display an image thereon;
    a cover to support the display and to enclose internal parts of the display apparatus;
    a printed circuit board (PCB) disposed within the cover to control the display and to receive a predetermined card;
    an air path to circulate air within the cover to cool the PCB and the internal parts of the display apparatus; and
    a cooling fan disposed along the air path to direct the air to a predetermined portion of the PCB corresponding to a location of the predetermined card installed on the PCB.

13. The display apparatus according to claim 12, wherein the cover comprises:
    air supply holes disposed at a first end of the air path and aligned with the cooling fan to supply air to the air path; and
    air exit holes disposed at a second end of the air path to discharge the air directed by the cooling fan from the air path.

14. The display apparatus according to claim 13, further comprising:
a shield cover disposed between the printed circuit board and the cover and including a fan exposing portion disposed along the air path between the air supply holes and the cooling fan to allow the cooling fan to communicate with the air supply holes.

15. The display apparatus according to claim 12, wherein the predetermined card comprises a point of deployment (POD) card.

16. A display apparatus, comprising:
a display to display an image thereon;
a printed circuit board (PCB) to control the display and to receive a predetermined card;
a fan assembly comprising a fan housing coupled to the PCB at a position corresponding to an installing position of the predetermined card on the PCB, a cooling fan mounted at the fan housing to circulate air toward the PCB, and a first card inserting hole formed at a side of the fan housing to allow the predetermined card to be inserted therethrough.

17. The display apparatus according to claim 16, further comprising:
a cover to support the display and to enclose the PCB and the fan assembly, the cover including one or more air holes formed therethrough at a position corresponding to the cooling fan to supply the air to the cooling fan and a second card inserting hole to allow the predetermined card to be inserted therethrough to connect to the PCB.

18. The display apparatus according to claim 17, further comprising:
a shield cover disposed between the cover and the fan assembly and the PCB and including a fan exposing hole communicating with the one or more air holes of the cover to supply the air to the cooling fan and a third card inserting hole communicating with the first and second card inserting holes to allow the predetermined card to be inserted therethrough to connect to the PCB.

19. The display apparatus according to claim 18, wherein the first, second, and third card inserting holes each have a predetermined size and a predetermined shape corresponding to the predetermined card.

* * * * *